United States Patent
Igarashi et al.

(10) Patent No.: US 11,094,525 B2
(45) Date of Patent: Aug. 17, 2021

(54) METHOD FOR CLEANING SEMICONDUCTOR WAFER

(71) Applicant: SHIN-ETSU HANDOTAI CO., LTD., Tokyo (JP)

(72) Inventors: Kensaku Igarashi, Nishigo-mura (JP); Tatsuo Abe, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 31 days.

(21) Appl. No.: 16/471,609

(22) PCT Filed: Dec. 20, 2017

(86) PCT No.: PCT/JP2017/045831
§ 371 (c)(1),
(2) Date: Jun. 20, 2019

(87) PCT Pub. No.: WO2018/135226
PCT Pub. Date: Jul. 26, 2018

(65) Prior Publication Data
US 2020/0105517 A1    Apr. 2, 2020

(30) Foreign Application Priority Data
Jan. 23, 2017  (JP) .............................. JP2017-009295

(51) Int. Cl.
*H01L 21/02* (2006.01)

(52) U.S. Cl.
CPC .............................. *H01L 21/02052* (2013.01)

(58) Field of Classification Search
CPC ................... H01L 21/02052; H01L 21/02041
See application file for complete search history.

(56) References Cited

U.S. PATENT DOCUMENTS

| | | | | |
|---|---|---|---|---|
| 2008/0016714 | A1* | 1/2008 | Kaneyama | H01L 21/67051 34/317 |
| 2012/0090649 | A1* | 4/2012 | Takahashi | H01L 21/02052 134/33 |
| 2016/0247698 | A1 | 8/2016 | Yoshizumi et al. | |

FOREIGN PATENT DOCUMENTS

| | | |
|---|---|---|
| JP | 2009-147038 A | 7/2009 |
| JP | 2009-272411 A | 11/2009 |
| JP | 2015-76558 A | 4/2015 |
| JP | 2015-220284 A | 12/2015 |

OTHER PUBLICATIONS

Mar. 6, 2018 International Search Report issued in International Patent Application No. PCT/JP2017/045831.
Jul. 23, 2019 International Preliminary Report on Patentability issued in International Patent Application No. PCT/JP2017/045831.
Mar. 31, 2021 Office Action issued in Taiwanese Patent Application No. 107100403.

* cited by examiner

*Primary Examiner* — Natasha N Campbell
(74) *Attorney, Agent, or Firm* — Oliff PLC

(57) ABSTRACT

A method for cleaning a semiconductor wafer, including: supplying a semiconductor wafer whose surface has an oxide film formed thereon with a cleaning solution capable of removing the oxide film; and cleaning, while rotating, the semiconductor wafer to remove the oxide film formed on the surface of the semiconductor wafer. The oxide film is removed such that a rotational speed of the semiconductor wafer is 300 rpm or more after the cleaning with the cleaning solution is started and before a water-repelling surface is attained, and then the rotational speed of the semiconductor wafer is changed to 100 rpm or less to completely remove the oxide film. A method for cleaning a semiconductor wafer by which both surface roughness improvement and surface defect suppression can be achieved.

17 Claims, 6 Drawing Sheets

[FIG. 1]
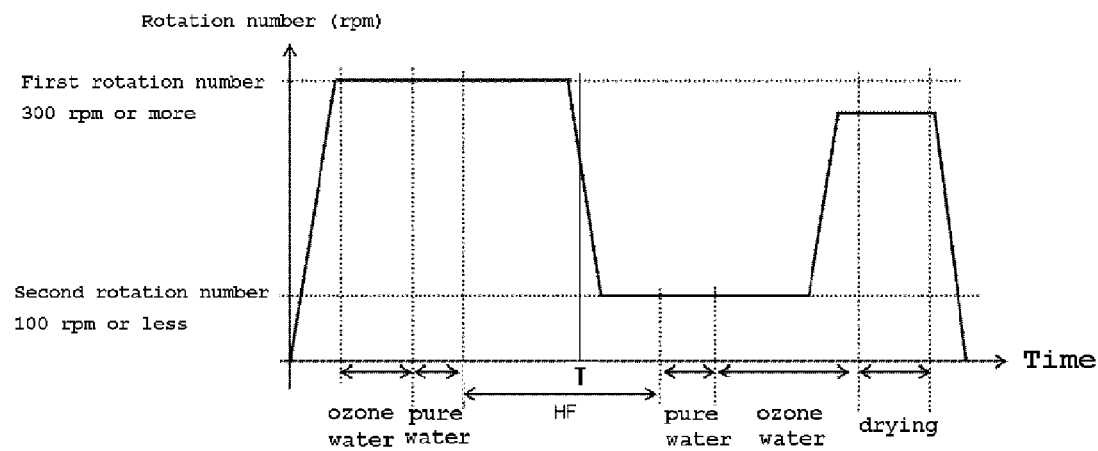

[FIG. 2]
(a) HF concentration: 0.2%
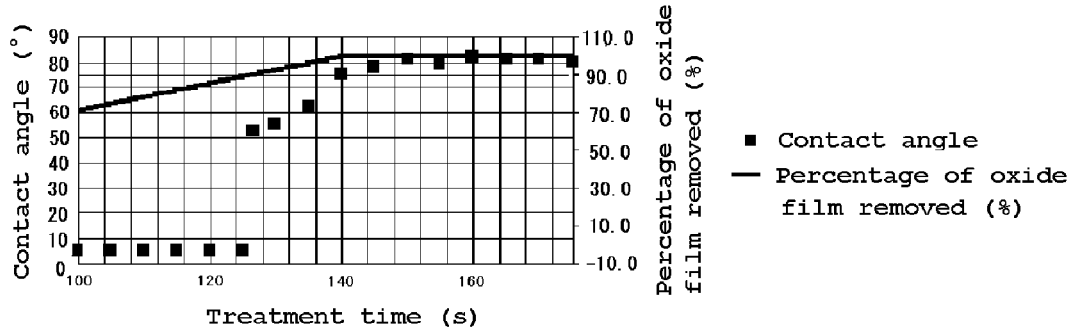
(b) HF concentration: 1.0%
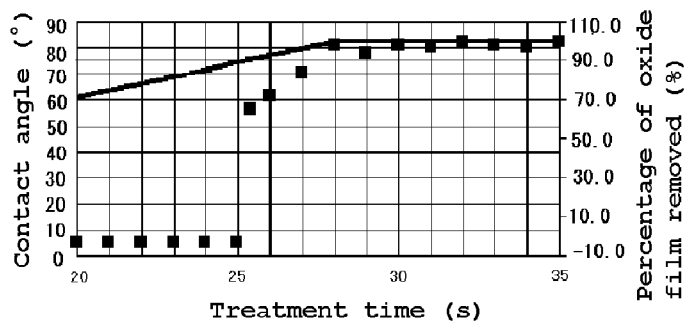
(c) HF concentration: 4.0%
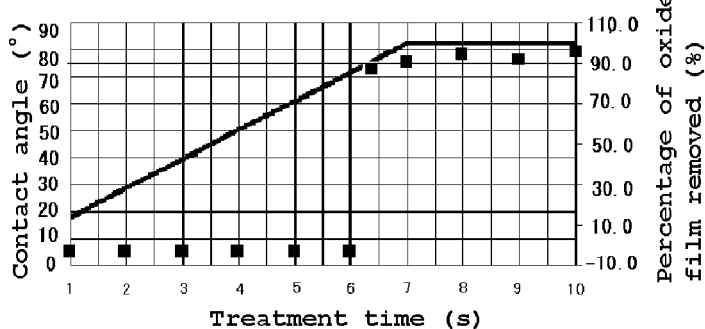

[FIG. 3]
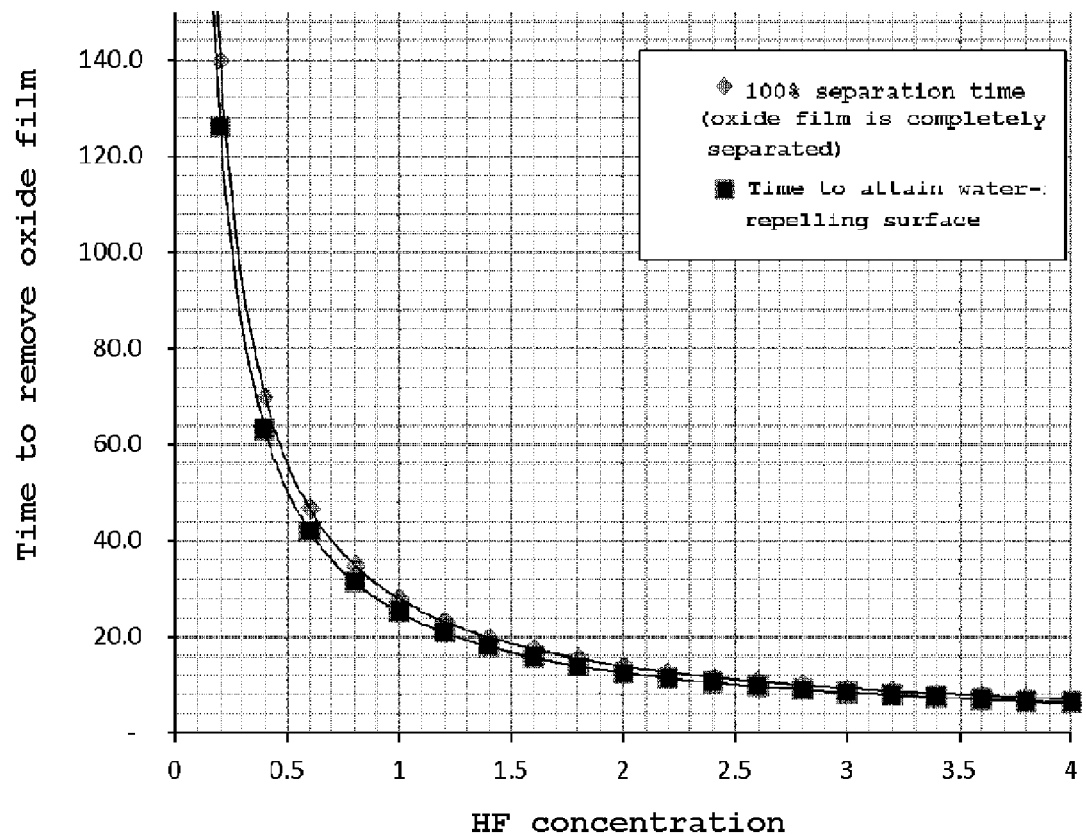

[FIG. 4]
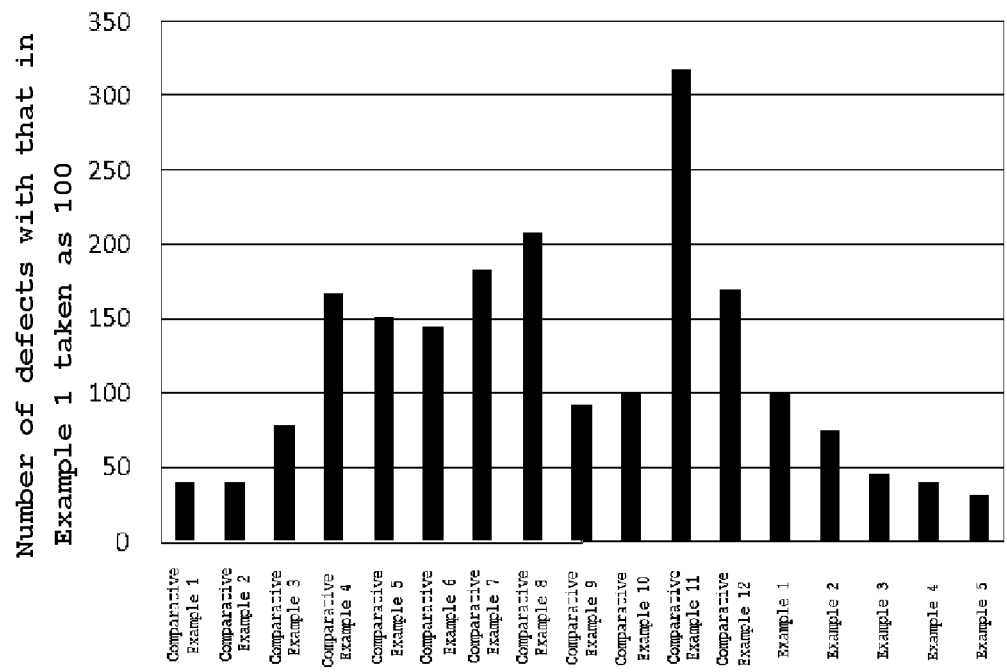
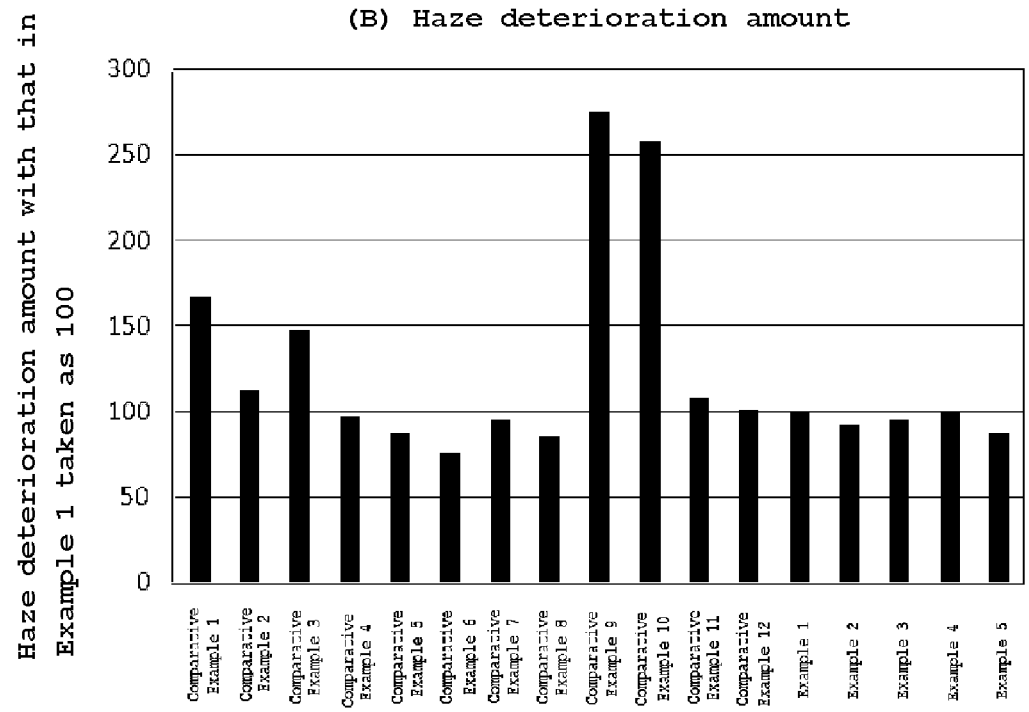

[FIG. 5]
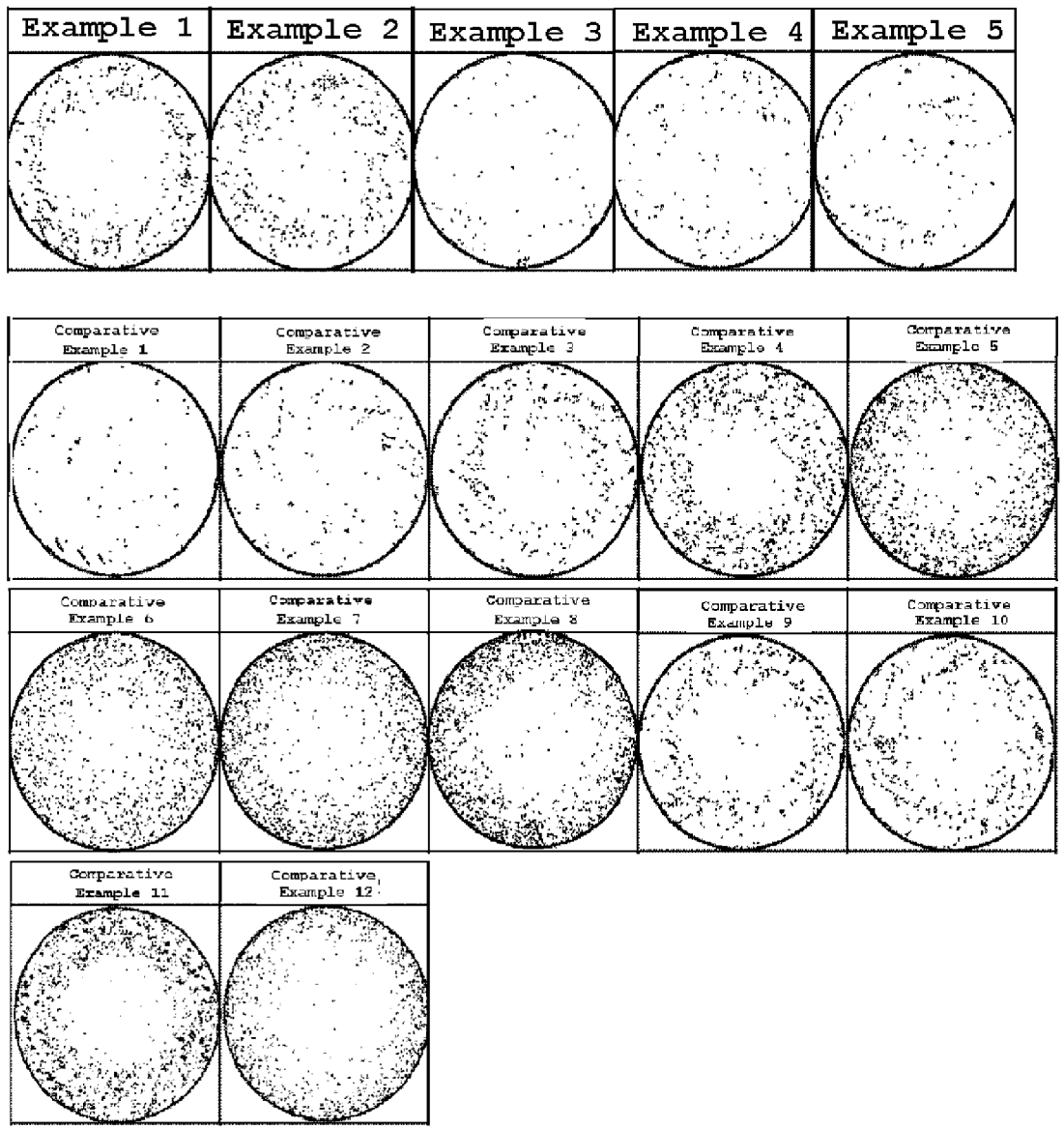

[FIG. 6]
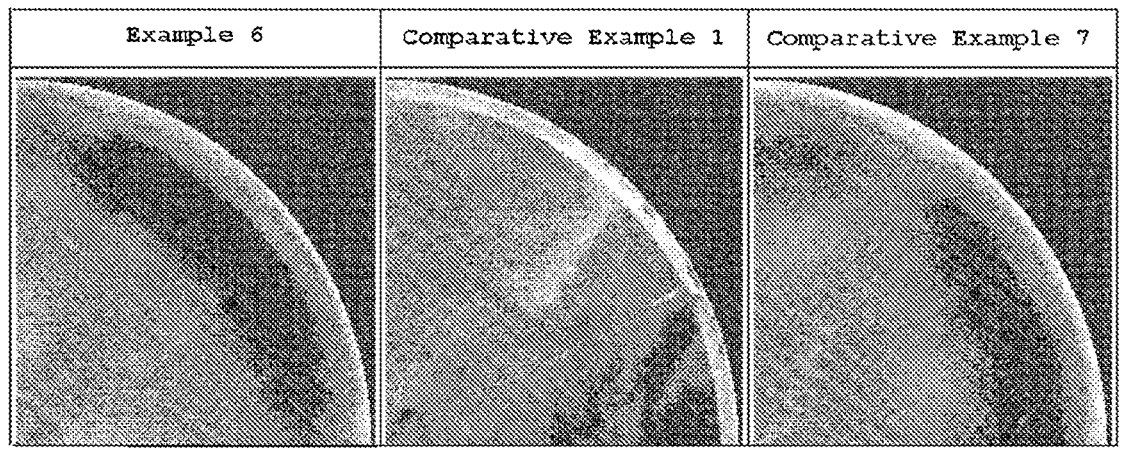
[FIG. 7]
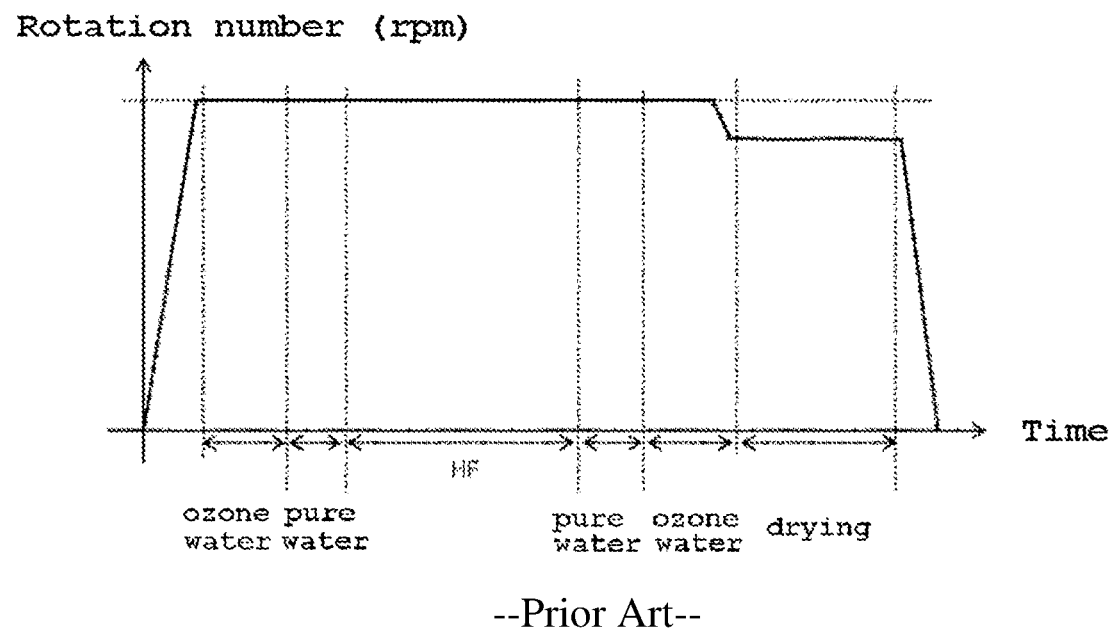
--Prior Art--

METHOD FOR CLEANING SEMICONDUCTOR WAFER

TECHNICAL FIELD

The present invention relates to a method for cleaning a semiconductor wafer.

BACKGROUND ART

In a water-repelling surface treatment for a semiconductor wafer (e.g., silicon wafer) by using a single-wafer-processing spin dryer, an oxide film formed on the surface of a semiconductor wafer is generally removed with a cleaning solution such as hydrofluoric acid (HF) from the semiconductor wafer (Patent Document 1).

FIG. 7 shows a graph illustrating the rotational speed of a semiconductor wafer in a conventional semiconductor-wafer cleaning process (cleaning with ozone water→pure water→hydrofluoric acid treatment→pure water→ozone water) and drying process. As shown in FIG. 7, in the conventional method, the rotation number during the hydrofluoric acid treatment is basically constant, and the rotation number is not changed.

Generally, after the hydrofluoric acid treatment is completed, pure water is used to replace hydrofluoric acid, and ozone water is used to form an oxide film again. Nevertheless, when such a treatment with pure water or ozone water is performed also, the rotation number is basically constant and is not different from that during the hydrofluoric acid treatment.

Conventionally, when a single-wafer-processing spin dryer is employed as described above, the rotation number is set constant, for example, at 300 rpm or more, to surely distribute the chemical solution to the outer peripheral portion of a wafer. However, after a hydrofluoric acid treatment at such a high speed is completed, if pure water- or ozone water-treatment, drying, and so forth are performed, micro particles and a water mark which resembles a water-flow pattern are increased, bringing about a problem that the wafer quality greatly deteriorates.

Further, although keeping the surface roughness of a wafer is also important, when the oxide film is removed by the HF treatment at a constant rotational speed of 100 rpm or less, for example, the solution remains at the wafer outer periphery, resulting in a problem that haze occurs locally.

CITATION LIST

Patent Literature

Patent Document 1: Japanese Unexamined Patent publication (Kokai) No. 2009-272411

SUMMARY OF INVENTION

Technical Problem

As described above, the conventional method for cleaning a semiconductor wafer has caused the phenomena that surface roughness deteriorates, and that surface defects such as water mark and micro particles are increased.

The present invention has been made in view of the above-described problems. An object of the present invention is to provide a method for cleaning a semiconductor wafer by which surface roughness deterioration and surface defect generation can be suppressed.

Solution to Problem

To achieve the object, the present invention provides a method for cleaning a semiconductor wafer, comprising:
supplying a semiconductor wafer whose surface has an oxide film formed thereon with a cleaning solution capable of removing the oxide film; and
cleaning, while rotating, the semiconductor wafer to remove the oxide film formed on the surface of the semiconductor wafer, wherein
the oxide film is removed such that a rotational speed of the semiconductor wafer is 300 rpm or more after the cleaning with the cleaning solution is started and before a water-repelling surface is attained, and
then the rotational speed of the semiconductor wafer is changed to 100 rpm or less to completely remove the oxide film.

Such a method for cleaning a semiconductor wafer makes it possible to suppress surface roughness deterioration and suppress surface defect generation.

Preferably, in this case, the semiconductor wafer is a silicon wafer, and the cleaning solution capable of removing the oxide film is hydrofluoric acid.

The inventive method for cleaning a semiconductor wafer is particularly effective in such a case.

Moreover, the oxide film removal at the rotational speed of 300 rpm or more is preferably performed before 90% of the oxide film formed on the surface of the semiconductor wafer is removed, and then the rotational speed of the semiconductor wafer is changed to 100 rpm or less to completely remove the oxide film.

Removing the oxide film in this manner can more reliably suppress surface roughness deterioration and suppress surface defect generation.

Further, the oxide film removal at the rotational speed of 300 rpm or more is preferably performed before the semiconductor wafer having the oxide film formed thereon has a contact angle of more than 5° with pure water, and then the rotational speed of the semiconductor wafer is changed to 100 rpm or less to completely remove the oxide film.

Removing the oxide film in this manner can more reliably suppress surface roughness deterioration and suppress surface defect generation.

Furthermore, after the oxide film formed on the surface of the semiconductor wafer is completely removed, cleaning with pure water or ozone water is preferably performed at the rotational speed of 100 rpm or less.

After the oxide film removal, performing cleaning with pure water or ozone water through low speed rotation as described above makes it possible to more reliably suppress generations of surface defects such as water mark and micro particles.

In addition, the oxide film can be a native oxide film.

Thus, the inventive method for cleaning a semiconductor wafer is particularly suitably utilizable when the oxide film is a native oxide film.

Advantageous Effects of Invention

The inventive method for cleaning a semiconductor wafer makes it possible to suppress surface roughness deterioration and surface defect generation, and obtain a high-quality semiconductor wafer.

BRIEF DESCRIPTION OF DRAWINGS

FIG. 1 is a graph illustrating an example of the rotational speed of a semiconductor wafer in a method for cleaning a semiconductor wafer of the present invention.

FIG. 2 shows graphs each illustrating changes in the contact angle and the percentage of the oxide film removed in an oxide-film removal process using hydrofluoric acid (0.2%, 1.0%, 4.0%).

FIG. 3 is a graph illustrating a relation between the time to remove a native oxide film and the hydrofluoric acid concentration.

FIG. 4 shows (A) the result of measuring the number of surface defects and (B) the result of measuring the haze deterioration amount in Examples and Comparative Examples.

FIG. 5 shows surface defect maps after drying in Examples and Comparative Examples.

FIG. 6 shows haze maps after the drying in Example 6, Comparative Example 1, and Comparative Example 7.

FIG. 7 is a graph illustrating the rotational speed of a semiconductor wafer in a conventional method for cleaning a semiconductor wafer.

DESCRIPTION OF EMBODIMENTS

As described above, the conventional method for cleaning a semiconductor wafer has problems that a localized haze abnormality occurs, and that surface defects such as water mark and micro particles are increased. Then, the present inventors have found that when an oxide film of a wafer is removed using a single-wafer-processing spin dryer, high speed rotation is required to keep the surface roughness, and low speed rotation is required to suppress the particles and water mark. Moreover, the inventors have found that after the water-repelling surface of a wafer is exposed, cleaning at high speed rotation facilitates repelling of the chemical solution, thereby increasing the particles and water mark.

Further, the present inventors have earnestly studied to achieve the object and consequently discovered that when the oxide film is removed by a high speed rotation at 300 rpm or more so as to keep the haze level before the water-repelling surface is attained and then the processing proceeds to a low speed rotation at 100 rpm or less to completely remove the oxide film, it is possible to suppress surface roughness deterioration and suppress surface defect generation. These findings have led to the present invention.

Specifically, the present invention provides a method for cleaning a semiconductor wafer, including:

supplying a semiconductor wafer whose surface has an oxide film formed thereon with a cleaning solution capable of removing the oxide film; and cleaning, while rotating, the semiconductor wafer to remove the oxide film formed on the surface of the semiconductor wafer, where the oxide film is removed such that a rotational speed of the semiconductor wafer is 300 rpm or more after the cleaning with the cleaning solution is started and before a water-repelling surface is attained, and then the rotational speed of the semiconductor wafer is changed to 100 rpm or less to completely remove the oxide film.

Hereinafter, the inventive method for cleaning a semiconductor wafer will be described.

A target to be cleaned is a semiconductor wafer having a surface with an oxide film formed thereon. The kind of the semiconductor wafer is not particularly limited, and an example thereof includes a silicon wafer. Moreover, the oxide film includes a native oxide film, a thermal oxide film, and the like, and a native oxide film (e.g., the film thickness: 0.5 nm to 1.5 nm) is preferable. Note that the native oxide film can be formed, for example, by cleaning with ozone water (e.g., ozone concentration: 3 ppm or more) or pure water.

Such a semiconductor wafer whose surface has an oxide film formed thereon is supplied with a cleaning solution capable of removing the oxide film, and cleaned, while the semiconductor wafer is being rotated, to remove the oxide film formed on the surface of the semiconductor wafer. The present invention is characterized in that this oxide film removal is performed such that a rotational speed of the semiconductor wafer is 300 rpm or more after the cleaning with the cleaning solution is started and before a water-repelling surface is attained, and then the rotational speed of the semiconductor wafer is changed to 100 rpm or less to completely remove the oxide film.

Such a method for cleaning a semiconductor wafer can suppress surface roughness deterioration and surface defect generation.

In cleaning a semiconductor wafer in the present invention, a conventionally-employed single-wafer-processing spin dryer can be used. Moreover, the cleaning solution capable of removing the oxide film is preferably hydrofluoric acid (e.g., 0.5 to 5.0 wt %).

After the cleaning with the cleaning solution capable of removing the oxide film is started and before the water-repelling surface is attained (particularly, immediately before the water-repelling surface is attained), the high speed rotation of 300 rpm or more (preferably 1000 rpm or more) makes it possible to keep the surface roughness, and suppress haze abnormality at the wafer outer periphery. After the cleaning is started and before the water-repelling surface is attained, if the rotational speed is less than 300 rpm, the haze level deteriorates. After the cleaning is started and before the water-repelling surface is attained, the upper limit of rotational speed is not particularly limited, and can be, for example, 5000 rpm or less.

After the oxide film is removed by the high speed rotation at 300 rpm or more before the water-repelling surface is attained (particularly, immediately before the water-repelling surface is attained), the rotational speed of the semiconductor wafer is changed to 100 rpm or less (preferably 50 rpm or less) to completely remove the oxide film. Thereby, generations of surface defects such as particles and water mark can be suppressed. If the high speed rotation of 300 rpm or more is performed in the state of water-repelling surface, or if the changed rotational speed exceeds 100 rpm, surface defect generations such as particles and water mark cannot be suppressed. The lower limit of the changed rotational speed is not particularly limited, and is preferably at least several rotations to obtain the cleaning effect.

The inventive method for cleaning a semiconductor wafer can be carried out as shown in FIG. 1;

specifically, cleaning is performed with ozone water and pure water to form an oxide film; next, after cleaning with a cleaning solution (HF) capable of removing the oxide film is started and before the water-repelling surface is attained (particularly, immediately before the water-repelling surface is attained), the oxide film removal is performed with a first rotation number of 300 rpm or more; then, the rotation is shifted to a second rotation number of 100 rpm or less to completely remove the oxide film. In FIG. 1, T indicates a timing at which "the water-repelling surface is attained."

In the present invention, the state of "water-repelling surface" can be defined using a contact angle of a semiconductor wafer, which has an oxide film formed thereon, with pure water. FIGS. 2 (a) to (c) show graphs each illustrating changes in the contact angle of a semiconductor wafer, which has an oxide film formed thereon, with pure water and the percentage of the oxide film removed in the oxide film removal process using hydrofluoric acid (0.2%, 1.0%, 4.0%). The contact angles shown in FIGS. 2 (a) to (c) are 5° or less (i.e., hydrophilic surface) for a while after the cleaning is started, but is thereafter rapidly increased, so that a water-repelling surface is obtained. In other words, the timing at which "the water-repelling surface is attained" in the present invention can be defined as a timing at which the contact angle between a semiconductor wafer, which has an oxide film formed thereon, and pure water exceeds 5°. Incidentally, the contact angle can be measured by using a portable contact angle meter PCA-11 manufactured by Kyowa Interface Science Co., Ltd.

Thus, surface roughness deterioration and surface defect generation can be more reliably suppressed by the method in which the oxide film removal at the rotational speed of 300 rpm or more is performed before the semiconductor wafer having the oxide film formed thereon has a contact angle of more than 5° with pure water, and then the rotational speed of the semiconductor wafer is changed to 100 rpm or less to completely remove the oxide film.

In this respect, as shown in FIGS. 2 (a) to (c), when the percentage of the oxide film removed is 90% or more, the wafer has a contact angle of more than 5° and has a water-repelling surface.

Accordingly, the present invention can also provide the method in which the oxide film removal at the rotational speed of 300 rpm or more is performed before 90% of the oxide film formed on the surface of the semiconductor wafer is removed, and then the rotational speed of the semiconductor wafer is changed to 100 rpm or less to completely remove the oxide film.

In the present invention, to reliably suppress surface roughness deterioration, the oxide film removal at the rotational speed of 300 rpm or more is preferably performed for the possible longest period before the water-repelling surface is attained. Thus, the oxide film removal is preferably performed immediately before 90% of the oxide film formed on the surface of the semiconductor wafer is removed, and the oxide film removal can be performed until 80% or more of the oxide film is removed.

Further, FIG. 3 shows a relation between the time to remove a native oxide film (time to completely separate the oxide film and time to attain the water-repelling surface) and the hydrofluoric acid concentration. For example, when the HF concentration is 1.0%, the time to completely separate the native oxide film (time required to remove 100% of the native oxide film) is 28 seconds. Since the native oxide film is removed (etched) at a constant speed, the percentage of the oxide film removed reaches 90% (i.e., the water-repelling surface is attained) at 25.2 seconds. Thus, in this case, the present invention can provide the method in which the oxide film removal by the high speed rotation at 300 rpm or more is performed before 25.2 seconds elapse after the cleaning with hydrofluoric acid is started, and then the rotation is switched to the low speed rotation at 100 rpm or less.

After the oxide film formed on the surface of the semiconductor wafer is completely removed, cleaning with pure water or ozone water (e.g., 3 ppm or more) is preferably performed to prevent the surface from contamination. Such cleaning with pure water or ozone water is preferably performed at the rotational speed of 100 rpm or less (particularly preferably 50 rpm or less). The cleaning with pure water or ozone water by the low speed rotation after the oxide film removal as described above can more reliably suppress generations of water mark, micro particles, etc.

The rotational speed after the oxide film formation by, for example, the cleaning with pure water or ozone water is not particularly limited, and may be high speed rotation at 300 rpm or more. After that, a drying process is preferably performed.

EXAMPLE

Hereinafter, the present invention will be more specifically described with reference to Examples and Comparative Examples. However, the present invention is not limited to these Examples.

Examples 1 to 5, Comparative Examples 1 to 12

Using a single-wafer-processing spin dryer, semiconductor wafers each having a diameter of 300 mm were cleaned and dried under conditions shown in Table 1 in the order of ozone water (first rotation number)→pure water (first rotation number)→hydrofluoric acid (first rotation number)→hydrofluoric acid (second rotation number)→pure water (second rotation number)→ozone (second rotation number)→ozone water (1000 rpm)→drying (1000 rpm). Note that the hydrofluoric acid concentration was 1.0%. In Examples 1 to 5 and Comparative Example 9 to 12, the cleaning with hydrofluoric acid with the first rotation number was performed until about 89% of the oxide film was removed, and then the rotation number was changed to the second rotation number to thus completely remove the oxide film. Note that when the hydrofluoric-acid cleaning with the first rotation number was completed, the wafer had a contact angle of 5° with pure water. Meanwhile, in Comparative Examples 1 to 8, the rotational speed was not changed in the oxide film removal process using hydrofluoric acid.

Tables 1, 2 show the results of the number of surface defects, ΔHaze (haze deterioration amount), and the presence or absence of haze abnormality in the dried semiconductor wafers. FIG. 4 shows graphs of (A) the number of defects, given that the value in Example 1 was taken as 100, and (B) the haze deterioration amount, given that the value in Example 1 was taken as 100. FIG. 5 shows surface defect maps of the dried semiconductor wafers. FIG. 6 shows haze maps after the drying in Comparative Example 1 and Comparative Example 7. It was revealed that Comparative Example 1 had a haze abnormality but Comparative Example 7 had no haze abnormality.

TABLE 1

|  | Example 1 | Example 2 | Example 3 | Example 4 | Example 5 |
|---|---|---|---|---|---|
| First rotation number | 300 rpm | 800 rpm | 1000 rpm | 1000 rpm | 1500 rpm |
| Second rotation number | 100 rpm | 100 rpm | 50 rpm | 100 rpm | 50 rpm |
| Number of defects | 747 | 566 | 346 | 300 | 232 |
| Defect level | good | good | good | good | good |
| ΔHaze | 1.13 ppb | 1.04 ppb | 1.07 ppb | 1.12 ppb | 0.98 ppb |
| Haze level | good | good | good | good | good |
| Haze abnormality | absent | absent | absent | absent | absent |

TABLE 2

| | Comparative Example 1 | Comparative Example 2 | Comparative Example 3 | Comparative Example 4 | Comparative Example 5 |
|---|---|---|---|---|---|
| First rotation number | 50 rpm | 80 rpm | 100 rpm | 150 rpm | 300 rpm |
| Second rotation number | | | | | |
| Number of defects | 305 | 300 | 586 | 1252 | 1133 |
| Defect level | good | good | good | poor | poor |
| ΔHaze | 1.89 ppb | 1.27 ppb | 1.67 ppb | 1.09 ppb | 0.98 ppb |
| Haze level | poor | poor | poor | good | good |
| Haze abnormality | present | present | present | absent | absent |

| | Comparative Example 6 | Comparative Example 7 | Comparative Example 8 | Comparative Example 9 | Comparative Example 10 |
|---|---|---|---|---|---|
| First rotation number | 500 rpm | 1000 rpm | 1500 rpm | 200 rpm | 150 rpm |
| Second rotation number | | | | 100 rpm | 100 rpm |
| Number of defects | 1084 | 1373 | 1557 | 692 | 756 |
| Defect level | poor | poor | poor | good | good |
| ΔHaze | 0.85 ppb | 1.07 ppb | 0.96 ppb | 3.10 ppb | 2.92 ppb |
| Haze level | good | good | good | poor | poor |
| Haze abnormality | absent | absent | absent | absent | absent |

| | Comparative Example 11 | Comparative Example 12 |
|---|---|---|
| First rotation number | 1000 rpm | 1000 rpm |
| Second rotation number | 150 rpm | 300 rpm |
| Number of defects | 2382 | 1269 |
| Defect level | poor | poor |
| ΔHaze | 1.22 ppb | 1.14 ppb |
| Haze level | good | good |
| Haze abnormality | absent | absent |

Example 6

Cleaning and drying were performed by the same method as in Examples 1 to 5 described above, except that the first rotation number was 1300 rpm and the second rotational speed was 50 rpm (Example 6). FIG. 6 shows a haze map in Example 6. Example 6 was revealed to have no haze abnormality.

By the spin cleaning at the single constant speed of 100 rpm or less, the haze deterioration amount was large, and haze abnormality occurred at the wafer outer periphery (Comparative Examples 1 to 3). Moreover, by the spin cleaning at the single constant speed of 150 rpm or more, water mark was generated, and the surface defect level deteriorated (Comparative Examples 4 to 8). Further, even when the rotational speed was changed during the oxide film removal using hydrofluoric acid, if the first rotation number was smaller than 300 rpm, the haze deterioration amount was large (Comparative Examples 9, 10); if the second rotation number was faster than 100 rpm, the number of surface defects was larger (Comparative Examples 11, 12). Note that it was revealed that, in Comparative Examples 9, 10, the haze abnormality occurred at the wafer outer periphery, but the abnormality was absent in appearance.

In contrast, as in Examples 1 to 6, shifting the high speed rotation of 300 rpm or more to the low speed rotation of 100 rpm or less during the oxide film removal treatment using hydrofluoric acid successfully suppressed the haze deterioration amount, and suppressed haze abnormality and surface defect generations such as water mark.

Table 3 summaries the above results and the results of cleaning and drying under the conditions shown in Table 3 (first rotation number, second rotation number). In Table 3, o indicates that a favorable number of defects, a favorable haze deterioration amount, and no haze abnormality; and x indicates the other states.

TABLE 3

| | | \multicolumn{9}{c}{First rotation number} | | | | | | | | |
|---|---|---|---|---|---|---|---|---|---|---|
| | | 50 | 80 | 100 | 150 | 200 | 300 | 800 | 1000 | 1500 |
| Second rotation number | 50 | X | X | X | X | X | O | O | O | O |
| | 80 | | X | X | X | X | O | O | O | O |
| | 100 | | | X | X | X | O | O | O | O |
| | 150 | | | | X | X | X | X | X | X |
| | 200 | | | | | X | X | X | X | X |
| | 300 | | | | | | X | X | X | X |
| | 800 | | | | | | | X | X | X |
| | 1000 | | | | | | | | X | X |
| | 1500 | | | | | | | | | X |

Comparative Example 13

Using a single-wafer-processing spin dryer, a semiconductor wafer having a diameter of 300 mm was cleaned and dried in the order of ozone water (300 rpm)→pure water (300 rpm)→hydrofluoric acid (300 rpm)→hydrofluoric acid (100 rpm)→pure water (100 rpm)→ozone (100 rpm)→ozone water (100 rpm)→drying (100 rpm). Note that the hydrofluoric acid concentration was 1.0%, the cleaning with hydrofluoric acid at 300 rpm was performed until about 90% of the oxide film was removed, and then the rotation number was changed to 100 rpm to thus completely remove the oxide film. Note that when the hydrofluoric acid cleaning with the first rotation number was completed, the wafer had a contact angle of 57° with pure water and had a water-repelling surface.

As a result, in Comparative Example 13, the number of surface defects was 1121, and the relative value was 150, given that the value in Example 1 was taken as 100; ΔHaze was 1.07 ppb, and the relative value was 95, given that the value in Example 1 was taken as 100. It was revealed that surface defects such as water mark and particles were increased by the oxide film removal treatment by the high speed rotation at 300 rpm or more after the water-repelling surface was attained.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for cleaning a semiconductor wafer, including:
   supplying a semiconductor wafer whose surface has an oxide film formed thereon with a cleaning solution capable of removing the oxide film; and
   cleaning, while rotating, the semiconductor wafer to remove the oxide film formed on the surface of the semiconductor wafer, wherein
   the oxide film is removed such that a rotational speed of the semiconductor wafer is 300 rpm or more until 80% or more of the oxide film formed on the surface of the semiconductor wafer is removed, and then the rotational speed of the semiconductor wafer is changed to 100 rpm or less to completely remove the oxide film.

2. The method for cleaning a semiconductor wafer according to claim 1, wherein
   the semiconductor wafer is a silicon wafer, and
   the cleaning solution capable of removing the oxide film is hydrofluoric acid.

3. The method for cleaning a semiconductor wafer according to claim 2, wherein
   the oxide film removal at the rotational speed of 300 rpm or more is performed before 90% of the oxide film formed on the surface of the semiconductor wafer is removed, and
   then the rotational speed of the semiconductor wafer is changed to 100 rpm or less to completely remove the oxide film.

4. The method for cleaning a semiconductor wafer according to claim 3, wherein
   the oxide film removal at the rotational speed of 300 rpm or more is performed before the semiconductor wafer having the oxide film formed thereon has a contact angle of more than 5° with pure water, and
   then the rotational speed of the semiconductor wafer is changed to 100 rpm or less to completely remove the oxide film.

5. The method for cleaning a semiconductor wafer according to claim 4, wherein after the oxide film formed on the surface of the semiconductor wafer is completely removed, cleaning with pure water or ozone water is performed at the rotational speed of 100 rpm or less.

6. The method for cleaning a semiconductor wafer according to claim 3, wherein after the oxide film formed on the surface of the semiconductor wafer is completely removed, cleaning with pure water or ozone water is performed at the rotational speed of 100 rpm or less.

7. The method for cleaning a semiconductor wafer according to claim 2, the oxide film removal at the rotational speed of 300 rpm or more is performed before the semiconductor wafer having the oxide film formed thereon has a contact angle of more than 5° with pure water, and
   then the rotational speed of the semiconductor wafer is changed to 100 rpm or less to completely remove the oxide film.

8. The method for cleaning a semiconductor wafer according to claim 7, wherein after the oxide film formed on the surface of the semiconductor wafer is completely removed, cleaning with pure water or ozone water is performed at the rotational speed of 100 rpm or less.

9. The method for cleaning a semiconductor wafer according to claim 1, wherein after the oxide film formed on the surface of the semiconductor wafer is completely removed, cleaning with pure water or ozone water is performed at the rotational speed of 100 rpm or less.

10. The method for cleaning a semiconductor wafer according to claim 1, wherein
    the oxide film removal at the rotational speed of 300 rpm or more is performed before 90% of the oxide film formed on the surface of the semiconductor wafer is removed, and
    then the rotational speed of the semiconductor wafer is changed to 100 rpm or less to completely remove the oxide film.

11. The method for cleaning a semiconductor wafer according to claim 10, wherein
    the oxide film removal at the rotational speed of 300 rpm or more is performed before the semiconductor wafer having the oxide film formed thereon has a contact angle of more than 5° with pure water, and
    then the rotational speed of the semiconductor wafer is changed to 100 rpm or less to completely remove the oxide film.

12. The method for cleaning a semiconductor wafer according to claim 11, wherein after the oxide film formed on the surface of the semiconductor wafer is completely removed, cleaning with pure water or ozone water is performed at the rotational speed of 100 rpm or less.

13. The method for cleaning a semiconductor wafer according to claim 10, wherein after the oxide film formed on the surface of the semiconductor wafer is completely removed, cleaning with pure water or ozone water is performed at the rotational speed of 100 rpm or less.

14. The method for cleaning a semiconductor wafer according to claim 1, wherein the oxide film removal at the rotational speed of 300 rpm or more is performed before the semiconductor wafer having the oxide film formed thereon has a contact angle of more than 5° with pure water, and
    then the rotational speed of the semiconductor wafer is changed to 100 rpm or less to completely remove the oxide film.

15. The method for cleaning a semiconductor wafer according to claim 14, wherein after the oxide film formed on the surface of the semiconductor wafer is completely removed, cleaning with pure water or ozone water is performed at the rotational speed of 100 rpm or less.

16. The method for cleaning a semiconductor wafer according to claim 1, wherein after the oxide film formed on the surface of the semiconductor wafer is completely removed, cleaning with pure water or ozone water is performed at the rotational speed of 100 rpm or less.

17. The method for cleaning a semiconductor wafer according to claim 1, wherein the oxide film is a native oxide film.

* * * * *